US011374524B2

(12) United States Patent
Sato et al.

(10) Patent No.: US 11,374,524 B2
(45) Date of Patent: Jun. 28, 2022

(54) POWER SOURCE CONTROL CIRCUIT

(71) Applicant: DAIKIN INDUSTRIES, LTD., Osaka (JP)

(72) Inventors: Toshiaki Sato, Osaka (JP); Toshio Yabuki, Osaka (JP); Narushige Ueda, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/270,219

(22) PCT Filed: Oct. 9, 2019

(86) PCT No.: PCT/JP2019/039834
§ 371 (c)(1),
(2) Date: Feb. 22, 2021

(87) PCT Pub. No.: WO2020/080224
PCT Pub. Date: Apr. 23, 2020

(65) Prior Publication Data
US 2021/0249983 A1 Aug. 12, 2021

(30) Foreign Application Priority Data
Oct. 16, 2018 (JP) .............................. JP2018-195161

(51) Int. Cl.
*H02P 27/06* (2006.01)
*F25B 49/02* (2006.01)
(Continued)

(52) U.S. Cl.
CPC ............ *H02P 27/06* (2013.01); *F25B 49/025* (2013.01); *G01R 19/16538* (2013.01);
(Continued)

(58) Field of Classification Search
CPC ........ H02P 23/14; H02P 27/06; F25B 49/025; F25B 2600/11; H02H 9/02; H02M 7/219
See application file for complete search history.

(56) References Cited

U.S. PATENT DOCUMENTS 4,816,985 A * 3/1989 Tanahashi ........... H02M 5/4585
363/81
8,796,982 B2 * 8/2014 Li ....................... H02P 29/0241
318/706
(Continued)

FOREIGN PATENT DOCUMENTS

CN 204513701 U 7/2015
CN 108292859 A 7/2018
(Continued)

OTHER PUBLICATIONS

English translation of International Preliminary Report on Patentability and Written Opinion of the International Searching Authority for International Application No. PCT /JP2019/039834, dated Apr. 29, 2021.
(Continued)

*Primary Examiner* — Rina I Duda
(74) *Attorney, Agent, or Firm* — Birch, Stewart, Kolasch & Birch, LLP

(57) ABSTRACT

In order to restrain damage of a component due to rush current, a main relay in a power source circuit is not turned on and does not conduct a power source line even when a heat source microcomputer is activated with a capacitor not sufficiently charged. This configuration avoids start of charging the capacitor without current limitation, to restrain damage of the component due to rush current.

16 Claims, 10 Drawing Sheets

(51) Int. Cl.
    *G01R 19/165*    (2006.01)
    *H02H 9/02*    (2006.01)
    *H02K 7/14*    (2006.01)
    *H02M 7/219*    (2006.01)
    *H02P 23/14*    (2006.01)

(52) U.S. Cl.
    CPC ............ *H02H 9/02* (2013.01); *H02K 7/14* (2013.01); *H02M 7/219* (2013.01); *H02P 23/14* (2013.01); *F25B 2600/11* (2013.01)

(56) References Cited

U.S. PATENT DOCUMENTS

| | | | |
|---|---|---|---|
| 9,577,534 B2 * | 2/2017 | Ishizeki | H02M 1/42 |
| 2008/0151583 A1 * | 6/2008 | Matsumoto | H02M 5/458 |
| | | | 363/34 |
| 2013/0033386 A1 | 2/2013 | Zlojutro | |
| 2013/0333861 A1 | 12/2013 | Takata | |
| 2015/0043257 A1 | 2/2015 | Nam | |
| 2015/0115854 A1 * | 4/2015 | Pottebaum | H02M 5/458 |
| | | | 318/445 |
| 2018/0375372 A1 | 12/2018 | Toyoda | |

FOREIGN PATENT DOCUMENTS

| | | |
|---|---|---|
| EP | 2001096 A2 | 12/2008 |
| EP | 2955839 A1 | 12/2015 |
| JP | 6-313606 A | 11/1994 |
| JP | 2005-257238 A | 9/2005 |
| JP | 2009-89535 A | 4/2009 |
| JP | 2013-201850 A | 10/2013 |
| JP | 2015-233396 A | 12/2015 |
| JP | 2017-184333 A | 10/2017 |

OTHER PUBLICATIONS

International Search Report, issued in PCT/JP2019/039834, dated Nov. 19, 2019.

Extended European Search Report for European Application No. 19874320.5, dated Aug. 20, 2021.

* cited by examiner

| | U PHASE | | V PHASE | | W PHASE | |
|---|---|---|---|---|---|---|
| | UPPER ARM | LOWER ARM | UPPER ARM | LOWER ARM | UPPER ARM | LOWER ARM |
| STATE | OFF | ON | OFF | ON | OFF | ON |

POWER SOURCE CONTROL CIRCUIT

TECHNICAL FIELD

The present disclosure relates to a power source circuit configured to supply a DC bus with electric power, a motor drive circuit including the power source circuit, and a refrigeration apparatus including the power source circuit or the motor drive circuit.

BACKGROUND ART

As in an electric power conversion device disclosed in Patent Literature 1 (JP 2015-233396 A) or the like, a power source circuit configured to supply a DC bus with electric power includes a main relay provided on a power source line connecting an AC power source and a rectifier circuit, and a current limiting circuit including a current limiting resistance and a current limiting relay is parallelly to the main relay. The main relay is kept off and the current limiting relay is turned on when the AC power source starts electric power supply, and the main relay is turned on and the current limiting relay is turned off after a capacitor is charged. This configuration prevents rush current from flowing to the capacitor.

SUMMARY OF THE INVENTION

Technical Problem

However, in a case where an electric power supply target of the power source circuit is a load like a brushless DC motor configured to generate induced voltage when rotated by external force, the power source circuit includes a control unit that can be activated with the induced voltage even when the power source circuit supplies no electric power.

When the control unit is activated with the induced voltage of the load, the main relay is turned on although the capacitor is not sufficiently charged, and rush current may flow to damage any component. This configuration thus needs to restrain rush current from damaging the component.

Solutions to Problem

A power source circuit according to a first aspect is configured to supply at least a pair of DC buses with electric power and including a rectifier circuit, a capacitor, a main relay, and a microcomputer. The rectifier circuit rectifies AC voltage of an AC power source. The capacitor smooths the voltage rectified by the rectifier circuit. The main relay turns on or off a contact point to switch into a state of conducting or a state of not conducting a power source line connecting the AC power source and the capacitor. The microcomputer determines whether or not to conduct the power source line. When the microcomputer is activated and the capacitor has charge voltage equal to or less than a predetermined value, the microcomputer controls the main relay so as not to conduct the power source line.

The main relay does not conduct the power source line in this power source circuit even when the microcomputer is activated with the capacitor not sufficiently charged.

A power source circuit according to a second aspect is the power source circuit according to the first aspect, further including a voltage detector configured to detect DC bus voltage. The microcomputer does not conduct the power source line when the voltage detector has a detection value equal to or less than a predetermined threshold.

Actual DC bus voltage is acquired in this power source circuit, and whether or not the DC bus voltage increases is thus determined. The main relay does not conduct the power source line when the DC bus voltage does not have an appropriate value.

A power source circuit according to a third aspect is the power source circuit according to the second aspect, in which the voltage detector detects, as the DC bus voltage, interterminal voltage of the capacitor.

Actual interterminal voltage of the capacitor is detected as the DC bus voltage in this power source circuit. Accordingly, the main relay does not conduct the power source line even when the microcomputer is activated with the capacitor not charged.

A power source circuit according to a fourth aspect is the power source circuit according to the first aspect, further including a power-source voltage phase detection circuit configured to detect a power-source voltage phase of the AC power source. The microcomputer does not conduct the power source line when the power-source voltage phase detection circuit does not detect any phase.

In this power source circuit, detection of no phase by the power-source voltage phase detection circuit indicates that the capacitor is not charged via a proper route, and the main relay does not conduct the power source line even when the microcomputer is activated.

A power source circuit according to a fifth aspect is the power source circuit according to the first aspect, further including a current limiting resistance and a charge current detector. The current limiting resistance limits current flowing to the capacitor. The charge current detector detects current flowing to the current limiting resistance. The microcomputer does not conduct the power source line when the charge current detector does not detect any current.

In this power source circuit, detection of no current flowing to the current limiting resistance indicates that the capacitor is not charged via the proper route, and the main relay does not conduct the power source line even when the microcomputer is activated.

A power source circuit according to a sixth aspect is the power source circuit according to the first aspect, further including a current limiting resistance and a current limiting relay. The current limiting resistance limits current flowing to the capacitor. The current limiting relay turns on or off the contact point to switch into a first state where current flows to the current limiting resistance or a second state where no current flows to the current limiting resistance. The microcomputer does not conduct the power source line when the current limiting relay is in the second state.

In this power source circuit, the current limiting relay not in the first state indicates that the capacitor is not charged via the proper route, and the main relay does not conduct the power source line even when the microcomputer is activated.

A motor drive circuit according to a seventh aspect is configured to drive a DC motor and includes the power source circuit according to any one of the first to sixth aspects, configured to supply the DC motor with electric power.

A motor drive circuit according to an eighth aspect is the motor drive circuit according to the seventh aspect, further including a control power source. The control power source generates, from induced voltage of the DC motor, control voltage for activation of the microcomputer in the power source circuit.

In this motor drive circuit, even when the capacitor is charged with induced voltage of the motor, the control voltage is generated, and the microcomputer is accordingly activated, the capacitor is confirmed not to be charged via the proper route and the main relay does not conduct the power source line.

A refrigeration apparatus according to a ninth aspect includes a utilization unit and a heat source unit connected via a pipe to constitute a refrigerant circuit, and the motor drive circuit according to the seventh or the eighth aspect, applied to a DC motor included in the refrigeration apparatus.

A refrigeration apparatus according to a tenth aspect is the refrigeration apparatus according to the ninth aspect, in which the heat source unit includes a heat-source heat exchanger functioning as a radiator or an evaporator of the refrigerant circuit, and a fan configured to generate an air flow to the heat-source heat exchanger. The motor drive circuit drives a DC motor included in the fan.

In this refrigeration apparatus, even when the fan is rotated by external force, the capacitor is charged with induced voltage of the motor, the control voltage is generated, and the microcomputer is accordingly activated, the capacitor is confirmed not to be charged via the proper route and the main relay does not conduct the power source line.

A refrigeration apparatus according to an eleventh aspect includes a utilization unit and a heat source unit connected via a pipe to constitute a refrigerant circuit, and further includes the power source circuit according to the sixth aspect, configured to supply a DC motor included in the refrigeration apparatus with electric power, and a utilization communicator and a heat source communicator provided for communication between the utilization unit and the heat source unit. The microcomputer in the power source circuit does not conduct the power source line when the microcomputer acquires information indicating that the current limiting relay is in the second state from information transmitted between the utilization communicator and the heat source communicator.

In this refrigeration apparatus, failing to confirm that the current limiting relay is brought into the first state from communication information indicates that the capacitor is not charged via the proper route, and the main relay does not conduct the power source line even when the microcomputer is activated.

A refrigeration apparatus according to a twelfth aspect is the refrigeration apparatus according to the eleventh aspect, in which the heat source unit includes a heat-source heat exchanger functioning as a radiator or an evaporator of the refrigerant circuit, and a fan configured to generate an air flow to the heat-source heat exchanger. The power source circuit supplies a DC motor included in the fan with electric power.

In this refrigeration apparatus, the capacitor is confirmed not to be charged via the proper route even when the fan is rotated by external force and the capacitor is charged with induced voltage of the motor, and the main relay does not conduct the power source line even when the microcomputer is activated.

A power source circuit according to a thirteenth aspect is the refrigeration apparatus according to the eleventh or twelfth aspect, further including a control power source. The control power source generates, from induced voltage of the DC motor, control voltage for activation of the microcomputer in the power source circuit.

In this refrigeration apparatus, even when the fan is rotated by external force, the capacitor is charged with induced voltage of the motor, the control voltage is generated, and the microcomputer is accordingly activated, the capacitor is confirmed not to be charged via the proper route and the main relay does not conduct the power source line.

A refrigeration apparatus according to a fourteenth aspect is the refrigeration apparatus according to any one of the ninth to thirteenth aspects, further including a heat source microcomputer configured to control the heat source unit. The heat source microcomputer also functions as the microcomputer for the power source circuit.

DESCRIPTION OF EMBODIMENTS

First Embodiment (1) Outline of Air Conditioner 100

Figure 1:
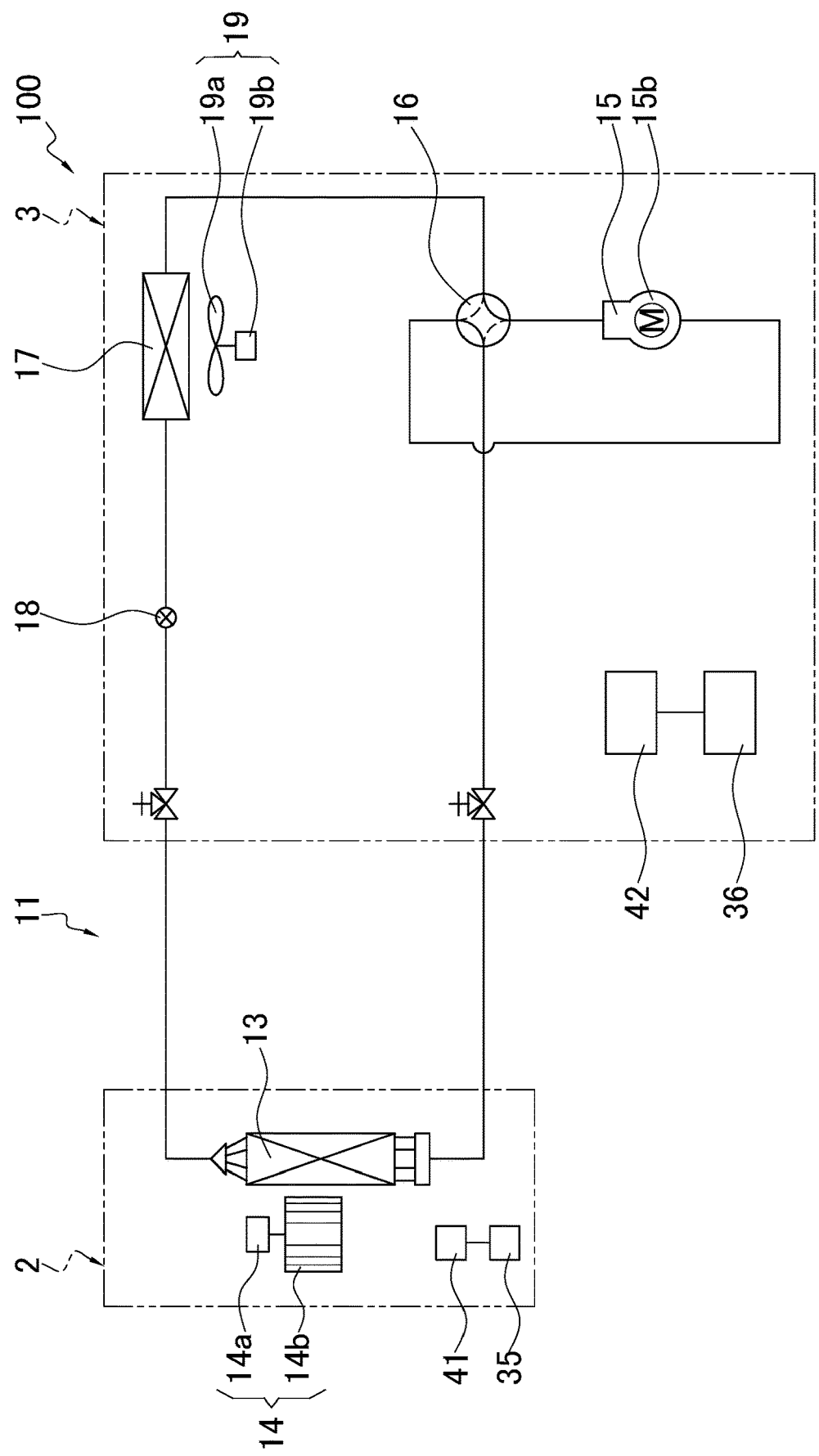
FIG. 1 is a configuration diagram of an air conditioner functioning as a refrigeration apparatus equipped with a power source circuit according to a first embodiment of the present disclosure.

FIG. 1 is a configuration diagram of the air conditioner 100 functioning as a refrigeration apparatus equipped with a power source circuit according to the first embodiment of the present disclosure. The air conditioner 100 depicted in FIG. 1 includes a utilization unit 2 and a heat source unit 3.

The air conditioner 100 includes a refrigerant circuit 11 including a compressor 15, a four-way switching valve 16, a heat-source heat exchanger 17, an expansion valve 18 functioning as a decompression mechanism, and a utilization heat exchanger 13 connected via a refrigerant pipe to form a circular shape.

(1-1) Utilization Unit 2

The utilization heat exchanger 13 in the refrigerant circuit 11 belongs to the utilization unit 2. The utilization unit 2 is also equipped with a utilization fan 14. The utilization fan 14 generates an air flow to the utilization heat exchanger 13.

Figure 2:
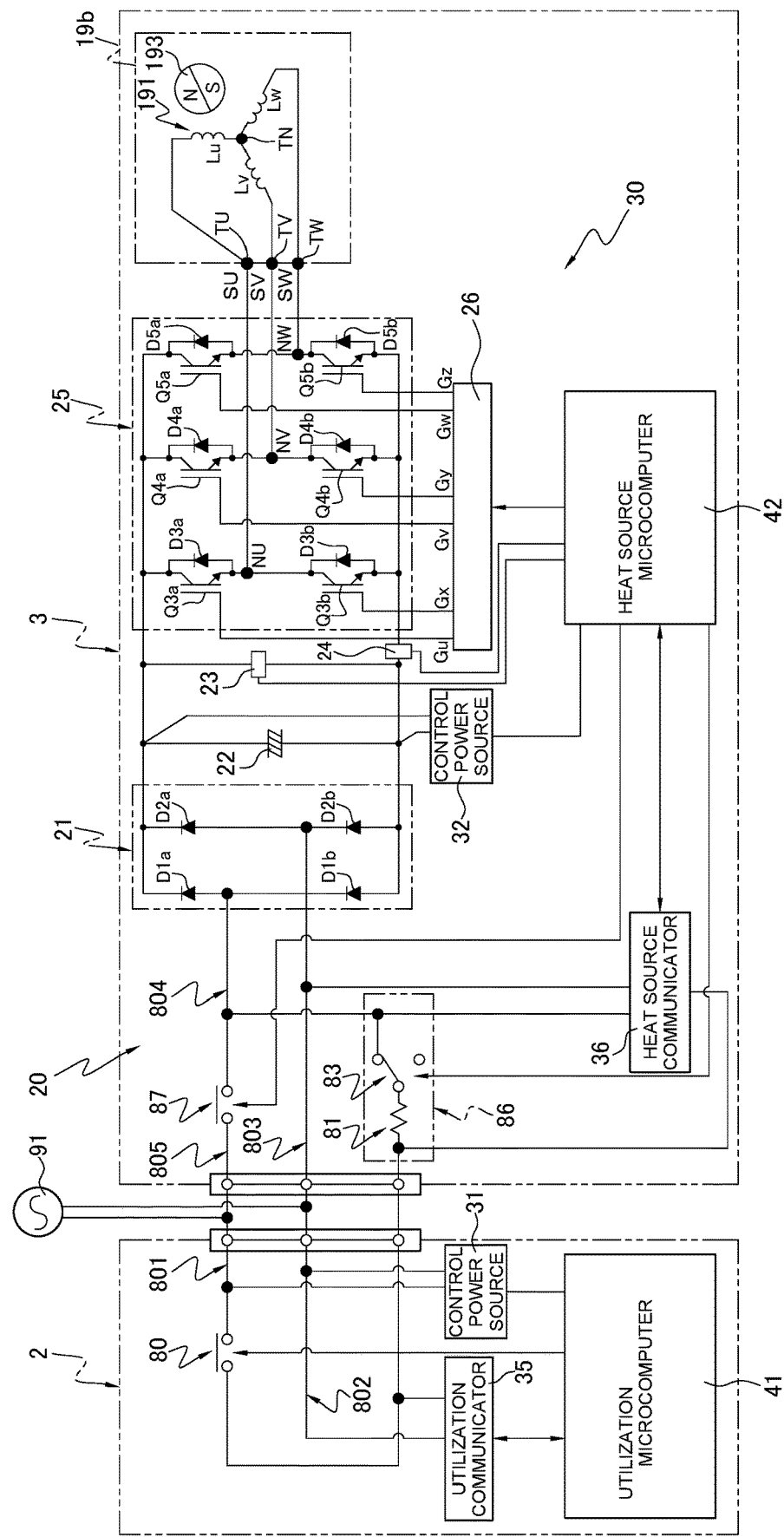
FIG. 2 is a circuit block diagram of a motor drive circuit including the power source circuit according to the first embodiment of the present disclosure.

FIG. 2 is a circuit block diagram of a motor drive circuit 30 including a power source circuit 20 according to the first embodiment of the present disclosure. The utilization unit 2 depicted in FIG. 2 is equipped with a control power source 31, a utilization communicator 35, and a utilization microcomputer 41. Both the control power source 31 and the utilization communicator 35 are connected to the utilization microcomputer 41.

The utilization communicator 35 is used when the utilization unit 2 communicates with the heat source unit 3. The control power source 31 receives electric power from an AC power source 91 via power source lines 801 and 802 and supplies the utilization microcomputer 41 with control voltage. The utilization microcomputer 41 is thus activated in a standby state where the air conditioner 100 is not in operation.

(1-2) Heat Source Unit 3

The compressor 15, the four-way switching valve 16, the heat-source heat exchanger 17, and the expansion valve 18 in the refrigerant circuit 11 belong to the heat source unit 3. The heat source unit 3 is also equipped with a heat source fan 19. The heat source fan 19 generates an air flow to the heat-source heat exchanger 17.

As depicted in FIG. 2, the heat source unit 3 is equipped with the motor drive circuit 30, a control power source 32, a heat source communicator 36, and a heat source microcomputer 42. The motor drive circuit 30, the control power source 32, and the heat source communicator 36 are each connected to the heat source microcomputer 42.

The motor drive circuit 30 is configured to drive a fan motor 19b. The heat source communicator 36 is used when the heat source unit 3 communicates with the utilization unit 2. The control power source 32 supplies the heat source microcomputer 42 with control voltage. The heat source microcomputer 42 controls the fan motor 19b via the motor drive circuit 30, and further controls a different device in the heat source unit 3.

The fan motor 19b is configured as a three-phase brushless DC motor, and includes a stator 191 and a rotor 193. The stator 191 includes drive coils Lu, Lv, and Lw for U, V, and W phases, and the drive coils are connected to form a star shape. The drive coils Lu, Lv, and Lw have first ends connected to drive coil terminals TU, TV, and TW of wires for the U, V, and W phases, respectively, extending from an inverter 25. The drive coils Lu, Lv, and Lw have second ends connected together to constitute a terminal TN. When the rotor 193 rotates, the drive coils Lu, Lv, and Lw for the three phases each generate induced voltage according to rotational speed and a position of the rotor 193.

The rotor 193 includes permanent magnets serving as a plurality of poles including an N pole and an S pole, and rotates about an axis with respect to the stator 191.

(2) Detailed Configuration of Motor Drive Circuit 30

As depicted in FIG. 2, the motor drive circuit 30 is included in the heat source unit 3. The motor drive circuit 30 mainly includes the power source circuit 20, the inverter 25, a gate drive circuit 26, the control power source 32, and the heat source microcomputer 42.

The power source circuit 20 mainly includes a rectifier circuit 21, a capacitor 22, a voltage detector 23, and a current limiting circuit 86. The heat source microcomputer 42 operates various relays to control the power source circuit 20, and is thus also a constituent element of the power source circuit 20.

(2-1) Rectifier Circuit 21

The rectifier circuit 21 includes four diodes D1a, D1b, D2a, and D2b to form a bridge. Specifically, the diodes D1a and D1b and the diodes D2a and D2b are respectively connected to each other in series. The diodes D1a and D2a each include a cathode terminal connected to a plus terminal of the capacitor 22, and functions as a positive output terminal of the rectifier circuit 21. The diodes D1b and D2b each include an anode terminal connected to a minus terminal of the capacitor 22, and functions as a negative output terminal of the rectifier circuit 21.

The diode D1a and the diode D1b have a connection point connected to a first one of poles of the AC power source 91 via a power source line 805, a main relay 87, and a power source line 804. The diode D2a and the diode D2b have a connection point connected to a second one of the poles of the AC power source 91 via a power source line 803. The rectifier circuit 21 rectifies AC voltage outputted from the AC power source 91 to generate DC voltage, and supplies the capacitor 22 with the DC voltage.

(2-2) Capacitor 22

The capacitor 22 has a first end connected to the positive output terminal of the rectifier circuit 21, and a second end connected to the negative output terminal of the rectifier circuit 21. The capacitor 22 is charged with AC voltage via the rectifier circuit 21 and stores electric charges to smooth the rectified voltage. For easier description, voltage having been smoothed by the smoothing capacitor 22 will be called DC bus voltage Vdc.

The DC bus voltage Vdc is applied to the inverter 25 connected to an output end of the capacitor 22. Specifically, the rectifier circuit 21 and the capacitor 22 constitute the power source circuit 20 for the inverter 25.

Examples of the capacitor in terms of types include an electrolytic condenser, a film capacitor, and a tantalum capacitor. The capacitor 22 according to the present embodiment is configured as a film capacitor.

(2-3) Voltage Detector 23

The voltage detector 23 is connected to the output end of the capacitor 22, and is configured to detect voltage at each of ends of the capacitor 22, that is, the DC bus voltage Vdc. For example, the voltage detector 23 has two resistances connected to each other in series and parallelly connected to the capacitor 22, to allow the DC bus voltage Vdc to be divided. The two resistances form a connection point having a voltage value transmitted to the heat source microcomputer 42.

(2-4) Current Detector 24

The current detector 24 is provided between the capacitor 22 and the inverter 25, and is connected to the negative output terminal of the capacitor 22. The current detector 24 detects, after the fan motor 19b is activated, motor current flowing to the fan motor 19b, as a total value of currents for the three phases.

The current detector 24 may alternatively be constituted by, for example, an amplifier circuit including a shunt resistance and an operational amplifier configured to amplify voltage at each of ends of the resistance. The motor current detected by the current detector 24 is transmitted to the heat source microcomputer 42.

(2-5) Inverter 25

The inverter 25 includes three sets of upper and lower arms corresponding respectively to the drive coils Lu, Lv, and Lw for the U, V, and W phases in the fan motor 19b and connected parallelly to the output end of the capacitor 22.

The inverter 25 depicted in FIG. 2 includes a plurality of insulated gate bipolar transistors (IGBTs, hereinafter simply called transistors) Q3a, Q3b, Q4a, Q4b, Q5a, and Q5b, and a plurality of reflux diodes D3a, D3b, D4a, D4b, D5a, and D5b.

The transistors Q3a and Q3b, the transistors Q4a and Q4b, and the transistors Q5a and Q5b are respectively connected in series to constitute upper and lower arms, and output wires extend from connection points NU, NV, and NW thus formed to the drive coils Lu, Lv, and Lw for the corresponding phases.

The diodes D3a to D5b are connected parallelly to the transistors Q3a to Q5b such that collector terminals of the transistors are connected to cathode terminals of the diodes and emitter terminals of the transistors are connected to anode terminals of the diodes. The transistors and the diodes connected parallelly constitute switching elements.

When the inverter 25 receives the DC bus voltage Vdc from the capacitor 22 and the transistors Q3a to Q5b are turned on or off at timing commanded by the gate drive circuit 26, the inverter 25 generates drive voltages SU, SV, and SW used to drive the fan motor 19b. The drive voltages SU, SV, and SW are transmitted from the connection points NU, NV, and NW between the transistors Q3a and Q3b, the transistors Q4a and Q4b, and the transistors Q5a and Q5b to the drive coils Lu, Lv, and Lw of the fan motor 19b.

(2-6) Gate Drive Circuit 26

The gate drive circuit 26 changes the on or off state of each of the transistors Q3a to Q5b in the inverter 25 in accordance with command voltage from the heat source microcomputer 42. Specifically, the gate drive circuit 26 generates gate control voltages Gu, Gx, Gv, Gy, Gw, and Gz applied to gates of the transistors Q3a to Q5b to cause the inverter 25 to transmit to the fan motor 19b the pulsatile drive voltages SU, SV, and SW having a duty determined by the heat source microcomputer 42. The gate control voltages Gu, Gx, Gv, Gy, Gw, and Gz thus generated are applied to gate terminals of the transistors Q3a to Q5b.

(2-7) Control Power Source 32

The control power source 32 receives the DC bus voltage Vdc and generates control voltage. The DC bus voltage Vdc is interterminal voltage of the capacitor 22, and is dependent on a charge state of the capacitor 22, a power-source voltage phase, and a load state.

Typically, the capacitor 22 is charged gradually when current flowing with the AC voltage of the AC power source 91 flows through a current limiting resistance 81. While the air conditioner 100 is not in operation, the capacitor 22 is not charged without electric power supply from the AC power source 91, and the control power source 32 is not supplied with electric power.

Figure 3:
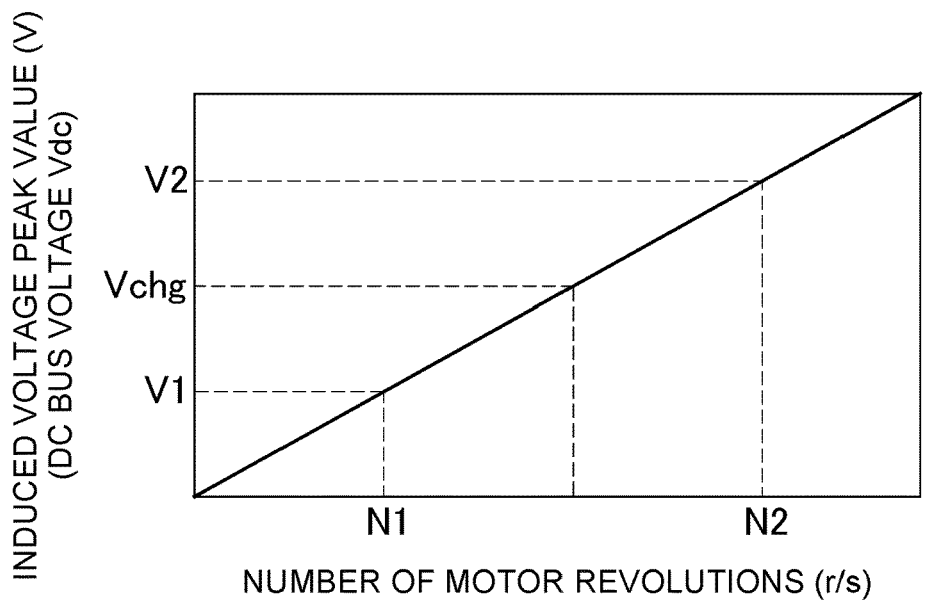
FIG. 3 is a graph indicating an induced voltage peak value relative to a number of motor revolutions.

The heat source unit 3 is typically disposed outdoors and strong wind thus rotates a propeller fan 19a of the heat source fan 19 to accordingly rotate the fan motor 19b. FIG. 3 is a graph indicating an induced voltage peak value relative to a number of motor revolutions. The fan motor 19b is configured as a brushless DC motor and generates induced voltage substantially in proportion to the number of revolutions as indicated in FIG. 3. The induced voltage thus generated increases the DC bus voltage Vdc.

When the fan motor 19b has a number of revolutions No equal to or more than N1 and the DC bus voltage Vdc reaches or exceeds a first threshold V1 with the induced voltage generated by the fan motor 19b, the control power source 32 according to the present embodiment is configured to generate control voltage with use of the DC bus voltage.

(2-8) Current Limiting Resistance 81

The current limiting resistance 81 is provided to gradually charge the capacitor 22. If the AC power source 91 is readily connected to the power source circuit 20 after the utilization unit 2 turns on an activation relay 80, excessive rush current may damage any electronic component constituting the inverter 25. Accordingly, the main relay 87 typically turns off contact points so as not to conduct the power source line connecting the AC power source 91 and the capacitor 22.

When the utilization unit 2 turns on the activation relay 80 in this configuration, AC voltage of the AC power source 91 is applied to the rectifier circuit 21 via the activation relay 80, the current limiting resistance 81, and the power source lines 804 and 803, and current according to a resistance value of the current limiting resistance 81 and the AC voltage of the AC power source 91 flows to the capacitor 22 to gradually charge the capacitor 22.

(2-9) Current Limiting Relay 83

The current limiting relay 83 has contact points that are normally on. When the utilization unit 2 turns on the activation relay 80, the current limiting resistance 81 and the rectifier circuit 21 are conducted to bypass the main relay 87.

Specifically, the current limiting relay 83 turns on or off the contact points to switch into a first state where current flows to the current limiting resistance 81 or a second state where no current flows to the current limiting resistance 81. The current limiting relay 83 turns off the contact points after the capacitor 22 is charged appropriately.

(2-10) Main Relay 87

The main relay 87 is connected to the power source line connecting the AC power source 91 and the capacitor 22. The main relay 87 switches into a state of conducting or a state of not conducting the power source line.

As already described, the contact points of the main relay 87 are turned off so as not to conduct the power source line, in order to prevent that the AC power source 91 is readily connected to the power source circuit 20 when the utilization unit 2 turns on the activation relay 80.

For easier description, a phenomenon that the contact points of the relay are turned on will be expressed as "the relay is turned on", and a phenomenon that the contact points of the relay are turned off will be expressed as "the relay is turned off". The main relay 87 is turned on after the capacitor 22 is charged appropriately and the current limiting relay 83 is turned off.

(2-11) Heat Source Microcomputer 42

The heat source microcomputer 42 is connected to the voltage detector 23, the current detector 24, and the gate drive circuit 26. The heat source microcomputer 42 according to the present embodiment drives the fan motor 19b in accordance with a rotor position sensorless system. The present disclosure is not limited to the rotor position sensorless system. The present disclosure may alternatively adopt a sensor system.

The rotor position sensorless system involves driving with estimation of a rotor position and the number of revolutions, PI control of the number of revolutions, PI control of motor current, and the like, with reference to various parameters indicating properties of the fan motor 19b, a result of detection by the voltage detector 23 and a result of detection by the current detector 24 after the fan motor 19b is activated, a predetermined formula model relevant to control of the fan motor 19b, and the like. Examples of the various parameters indicating the properties of the fan motor 19b include coil resistance, an inductance component, induced voltage, and the number of poles of the fan motor 19b to be used. Rotor position sensorless control is mentioned in many patent literatures to be referred to for details of the rotor position sensorless control (e.g. JP 2013-17289 A).

(3) Operation of Utilization Microcomputer 41 Until Main Relay is Turned on

As depicted in FIG. 2, the control power source 31 receives electric power from the AC power source 91 via the power source lines 801 and 802 and supplies the utilization microcomputer 41 with control voltage. The utilization microcomputer 41 is thus activated also in the standby state.

Figure 4:
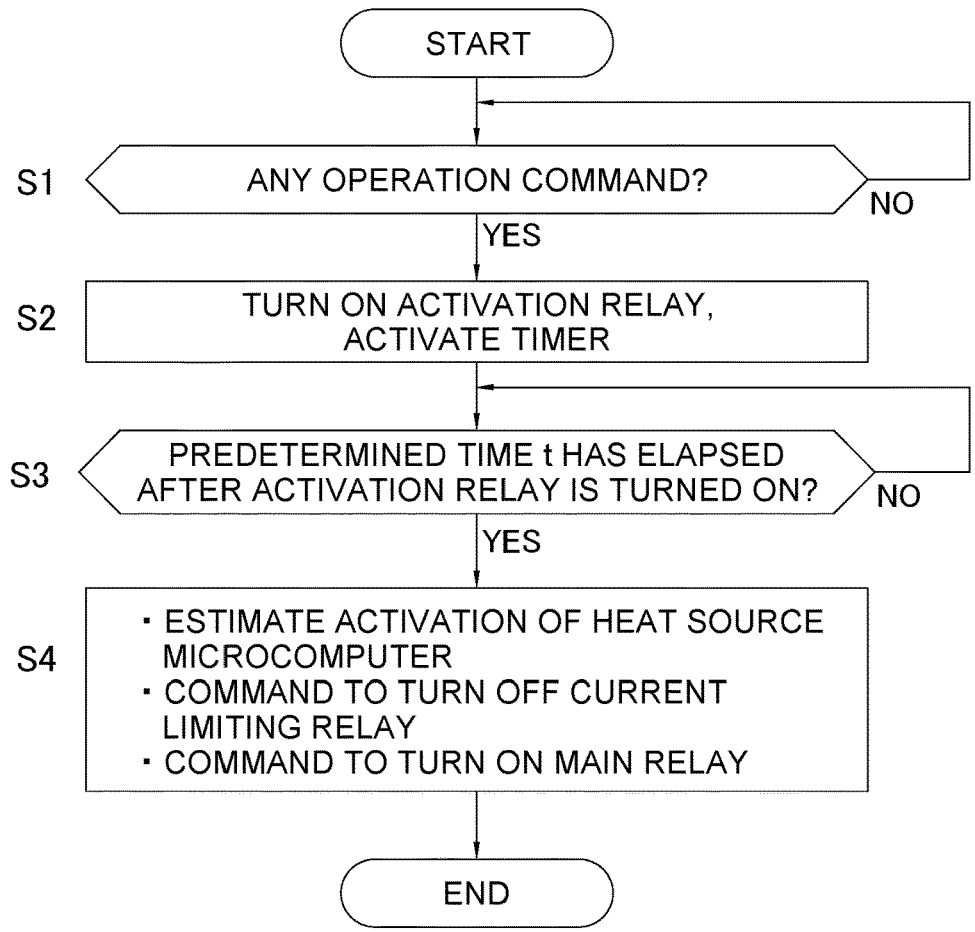
FIG. 4 is a flowchart depicting ordinary operation until activation of a heat source microcomputer.

FIG. 4 is a flowchart depicting ordinary operation until activation of the heat source microcomputer 42. The description below follows the flow in FIG. 4.

(Step S1)

In step S1, the utilization microcomputer 41 determines whether or not an operation command is issued. In an exemplary case where the air conditioner 100 receives, from a remote controller (not depicted), an operation command signal indicating "cooling operation", "heating operation", or "blowing operation", the utilization microcomputer 41 determines that "an operation command is issued".

(Step S2)

In step S2, the utilization microcomputer 41 turns on the activation relay 80 of the utilization unit 2 and simultaneously activates a timer. The flow then proceeds to step S3.

The utilization communicator 35 is supplied with electric power to become communicable when the activation relay 80 is turned on.

The current limiting circuit 86 of the heat source unit 3 is also supplied with electric power. As the contact points of the current limiting relay 83 in the current limiting circuit 86 are normally on, charge current flows to the capacitor 22 via the current limiting resistance 81. The heat source communicator 36 is also supplied with electric power in this case to become communicable.

(Step S3)

In step S3, the utilization microcomputer 41 determines whether or not predetermined time t has elapsed after the activation relay 80 of the utilization unit 2 is turned on. The flow proceeds to step S4 if the predetermined time t has elapsed.

If there is no circuit trouble, the interterminal voltage (DC bus voltage Vdc) of the capacitor 22 becomes equal to or more than the first threshold V1 after the activation relay 80 is turned on and before the predetermined time t elapses. The control power source 32 in the heat source unit 3 generates control voltage and the heat source microcomputer 42 is activated.

(Step S4)

In step S4, the utilization microcomputer 41 transmits, to the heat source communicator 36 via the utilization communicator 35, a "command to turn off the current limiting relay 83 and turn on the main relay 87".

The predetermined time t has elapsed after the activation relay 80 is turned on in preceding step S3, and the utilization microcomputer 41 accordingly estimates that the heat source microcomputer 42 is activated.

The heat source microcomputer 42 turns off the current limiting relay 83 and turns on the main relay 87 in accordance with the command received by the heat source communicator 36.

The above operation is executed to prevent start of charging the capacitor 22 without current limitation.

(4) Operation of Heat Source Microcomputer 42 Activated with Induced Voltage

In a case where the control power source 32 generates control voltage with use of induced voltage from the fan motor 19b and the main relay 87 is turned on with the capacitor 22 insufficiently charged, the capacitor 22 starts to be charged with current not flowing through the current limiting resistance 81. In this case, rush current may flow to damage any electronic component constituting the inverter 25.

In view of this, the heat source microcomputer 42 having been activated determines whether or not the capacitor 22 is charged via a proper route (a path through the current limiting resistance 81), and does not turn on the main relay 87 if the capacitor 22 is determined as not being charged via the proper route.

The heat source microcomputer 42 further detects the DC bus voltage Vdc without turning on the main relay 87, and estimates the number of revolutions No of the fan motor 19b.

In a case where the number of revolutions No becomes equal to or more than a predetermined number of revolutions N2 although the heat source microcomputer 42 does not output any number of revolutions command, the DC bus voltage Vdc may become equal to or more than a second threshold V2 to damage any electronic component. In order to avoid this, "voltage restraint control" is executed to restrain induced voltage and decrease the DC bus voltage Vdc. The following description is made with reference to a control flow.

Figures 5, 6:
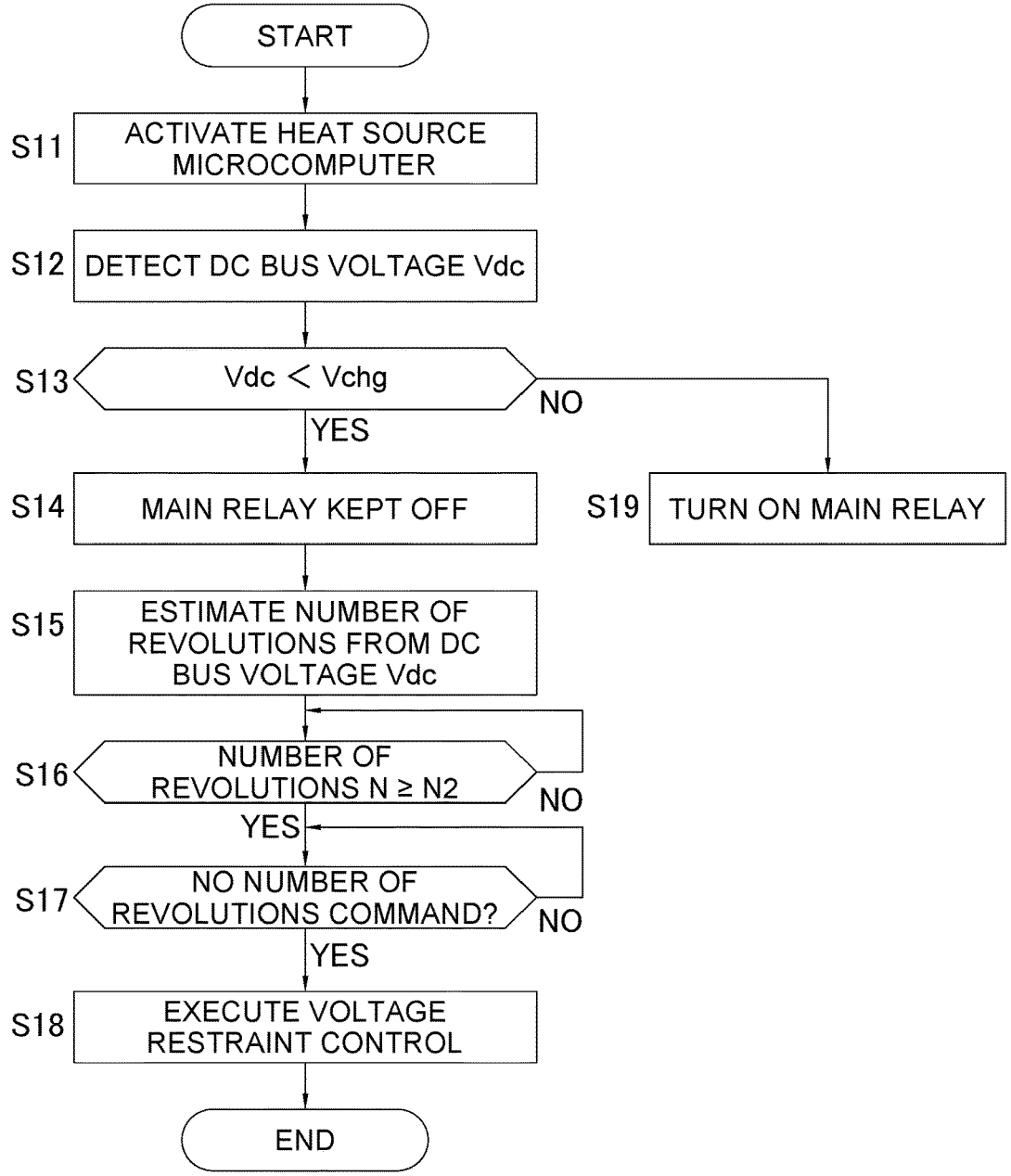
FIG. 5 is a flowchart from activation of the heat source microcomputer with induced voltage until voltage restraint control.
FIG. 6 is a chart indicating on and off states of transistors for upper and lower arms corresponding to U, V, and W phases during voltage restraint control.

FIG. 5 is a flowchart from activation of the heat source microcomputer 42 with induced voltage until voltage restraint control.

(Step S11)

Initially in step S11, the heat source microcomputer 42 is supplied with control voltage from the control power source 32 and is activated.

(Step S12)

Subsequently in step S12, the heat source microcomputer 42 detects the DC bus voltage Vdc by means of the voltage detector 23.

(Step S13)

Subsequently in step S13, the heat source microcomputer 42 determines whether or not the DC bus voltage Vdc reaches appropriate charge voltage Vchg. The flow proceeds to step S14 when the heat source microcomputer 42 determines that "the DC bus voltage Vdc does not reach the appropriate charge voltage Vchg (Vdc<Vchg)", and proceeds to step S19 in another case.

(Step S14)

Subsequently in step S14, the heat source microcomputer 42 does not turn on the main relay 87. The capacitor 22 is not sufficiently charged because Vdc<Vchg is satisfied. If the main relay 87 is turned on in this case, rush current may be generated to damage any component constituting the inverter 25.

(Step S15)

Subsequently in step S15, the heat source microcomputer 42 detects the DC bus voltage Vdc by means of the voltage detector 23, and estimates the number of revolutions No of the fan motor 19b.

(Step S16)

Subsequently in step S16, the heat source microcomputer 42 determines whether or not the number of revolutions No is equal to or more than the predetermined number of revolutions N2, and the flow proceeds to step S17 when the heat source microcomputer 42 determines that No N2 is satisfied.

(Step S17)

Subsequently in step S17, the heat source microcomputer 42 determines whether or not the number of revolutions command is outputted, and the flow proceeds to step S18 when the heat source microcomputer 42 determines that no number of revolutions command is outputted.

(Step S18)

Subsequently in step S18, the heat source microcomputer 42 executes "voltage restraint control" of controlling to restrain induced voltage of the fan motor 19b. Voltage restraint control is executed to brake the fan motor 19b, and details thereof will be described in a later section "voltage restraint control of heat source microcomputer 42".

(Step S19)

When the heat source microcomputer 42 determines that "the DC bus voltage Vdc reaches the appropriate charge voltage Vchg (Vdc≥Vchg)" in preceding step S13, the heat source microcomputer 42 turns on the main relay 87 in step S14. The capacitor 22 is sufficiently charged because Vdc≥Vchg is satisfied. Rush current will be restrained in this case even when the main relay 87 is turned on.

(5) Voltage Restraint Control of Heat Source Microcomputer 42

When the heat source microcomputer 42 having been activated determines that "the capacitor 22 is not charged to reach the appropriate charge voltage Vchg" or that "the capacitor 22 is not charged via the proper route", the heat source microcomputer 42 executes voltage restraint control of restraining induced voltage of the fan motor 19b without turning on the main relay 87.

Voltage restraint control involves braking the fan motor 19b. Voltage restraint control according to the present embodiment includes turning on all of either one of the two transistors Q3a and Q3b, the two transistors Q4a and Q4b, and the two transistors Q5a and Q5b for all the upper and lower arms to brake the fan motor 19b.

For example, all the transistors for the lower arms may be turned off and all the transistors for the upper arms may be turned on. Alternatively, all the transistors for the upper arms may be turned off and all the transistors for the lower arms may be turned on.

Figure 7:
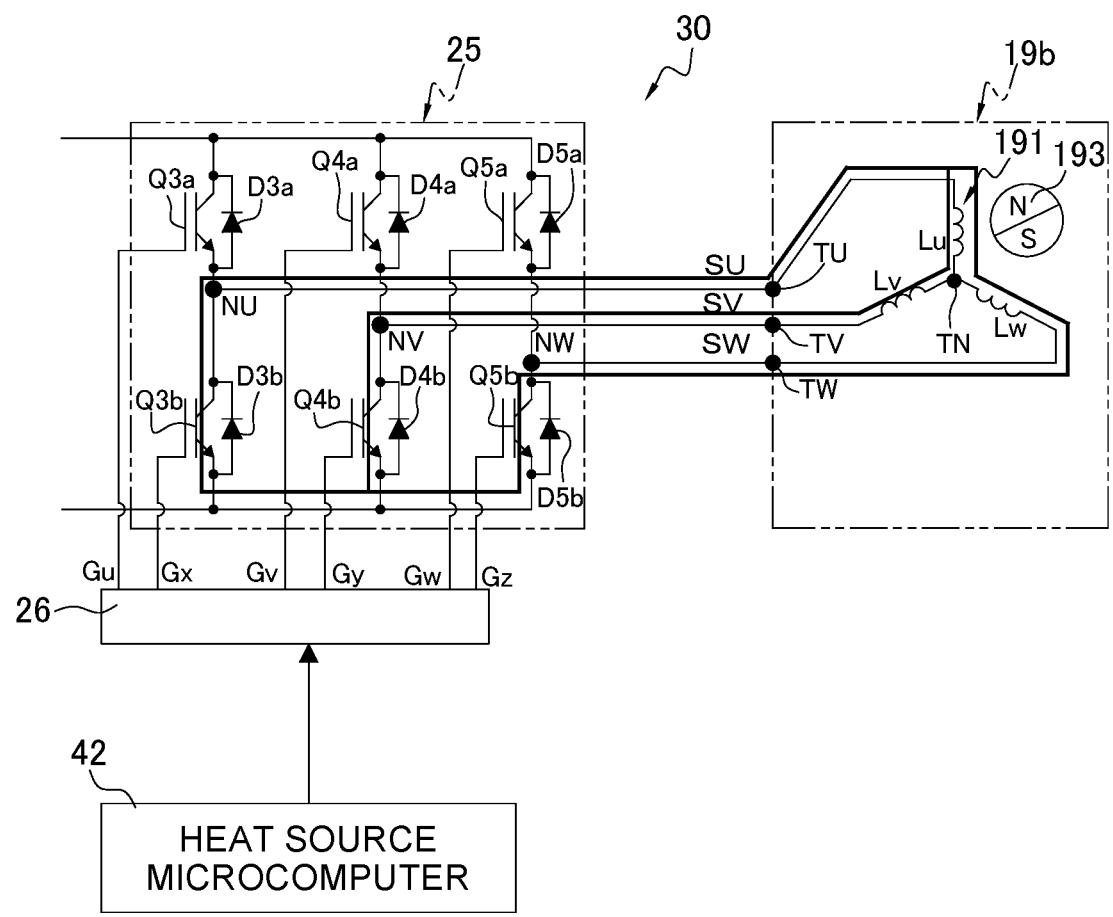
FIG. 7 is a conceptual diagram indicating current flowing in an inverter and a fan motor when all the transistors for the upper arms are turned off and all the transistors for the lower arms are turned on as indicated in FIG. 6.

FIG. 6 is a chart indicating the on and off states of the transistors for the upper and lower arms corresponding to the U, V, and W phases during voltage restraint control. FIG. 7 is a conceptual diagram indicating current flowing in the inverter 25 and the fan motor 19b when all the transistors for the upper arms are turned off and all the transistors for the lower arms are turned on as indicated in FIG. 6. The current flows in a direction changed in accordance with an induced voltage phase for each of the phases, that is, the position of the rotor in rotation.

As in FIG. 6 and FIG. 7 according to the present embodiment, all the transistors Q3a, Q4a, and Q5a for the upper arms are turned off and all the transistors Q3b, Q4b, and Q5b for the lower arms are turned on.

The transistors Q3b, Q4b, and Q5b for all the lower arms are turned on to return current flowing with induced voltage of the fan motor 19b, and prevent increase of the DC bus voltage Vdc due to the induced voltage of the fan motor 19b as well as cause current according to internal impedance of the fan motor 19b to flow to brake the fan motor 19b, so that increase of the number of revolutions is restrained and increase of the induced voltage is restrained.

(6) Modification Example of First Embodiment

The first embodiment described above exemplifies, as a condition for execution of voltage restraint control, that the number of revolutions No of the fan motor 19b is estimated in accordance with the value of the DC bus voltage Vdc and the heat source microcomputer 42 does not transmit any number of revolutions command to the gate drive circuit 26.

Voltage restraint control may alternatively be executed if the DC bus voltage Vdc reaches a value that may cause damage of any electronic component, without estimation of the number of revolutions No of the fan motor 19b.

With reference to the drawings, description is made below to control of the main relay 87 by the heat source microcomputer 42 according to the modification example.

Figure 8:
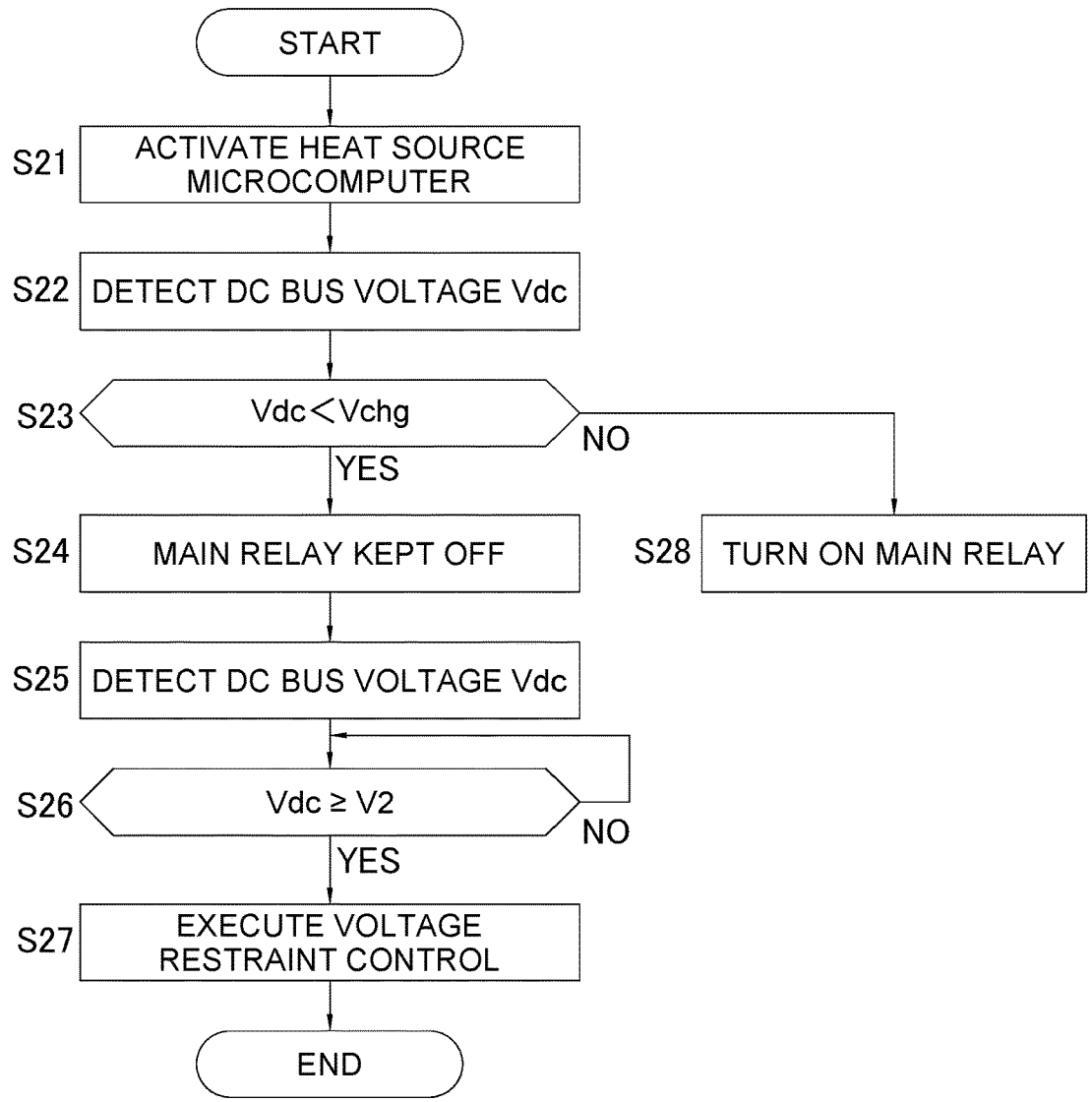
FIG. 8 is a flowchart according to a modification example, from activation of the heat source microcomputer with induced voltage until voltage restraint control.

FIG. 8 is a flowchart according to the modification example, from activation of the heat source microcomputer 42 with induced voltage until voltage restraint control.

(Step S21)

Initially in step S21, the heat source microcomputer 42 is supplied with control voltage from the control power source 32 and is activated.

(Step S22)

Subsequently in step S22, the heat source microcomputer 42 detects the DC bus voltage Vdc by means of the voltage detector 23.

(Step S23)

Subsequently in step S23, the heat source microcomputer 42 determines whether or not the DC bus voltage Vdc reaches the appropriate charge voltage Vchg. The flow proceeds to step S24 when the heat source microcomputer 42 determines that Vdc<Vchg is satisfied, and proceeds to step S28 in another case.

(Step S24)

Subsequently in step S24, the heat source microcomputer 42 does not turn on the main relay 87. The capacitor 22 is not sufficiently charged because Vdc<Vchg is satisfied. If the main relay 87 is turned on in this case, rush current may be generated to damage any component constituting the inverter 25.

(Step S25)

Subsequently in step S25, the heat source microcomputer 42 detects the DC bus voltage Vdc by means of the voltage detector 23.

(Step S26)

Subsequently in step S26, the heat source microcomputer 42 determines whether or not the detection value (Vdc) of the voltage detector 23 is equal to or more than the second threshold V2, and the flow proceeds to step S27 when the heat source microcomputer 42 determines that Vdc≥V2 is satisfied.

(Step S27)

Subsequently in step S27, the heat source microcomputer 42 executes "voltage restraint control" as described in the above first embodiment.

(Step S28)

When the heat source microcomputer 42 determines that "the DC bus voltage Vdc reaches the appropriate charge voltage Vchg" in preceding step S23, the heat source microcomputer 42 turns on the main relay 87 in step S28. The capacitor 22 is sufficiently charged because the DC bus voltage Vdc the appropriate charge voltage Vchg is satisfied. Rush current will be restrained in this case even when the main relay 87 is turned on.

(7) Characteristics (7-1)

In the power source circuit 20, the main relay 87 is not turned on and does not conduct the power source line even when the heat source microcomputer 42 is activated with the capacitor 22 not sufficiently charged. This configuration avoids start of charging the capacitor 22 without current limitation, to restrain damage of any component due to rush current.

(7-2)

In the power source circuit 20, the voltage detector 23 detects actual DC bus voltage Vdc and whether or not the DC bus voltage Vdc increases is determined. The main relay 87 is not turned on and does not conduct the power source line when the DC bus voltage does not have an appropriate value.

(7-3)

In the power source circuit 20, actual interterminal voltage of the capacitor 22 is detected as the DC bus voltage Vdc. Accordingly, the main relay 87 is not turned on and does not conduct the power source line even when the heat source microcomputer 42 is activated with the capacitor 22 not charged.

(7-4)

In the motor drive circuit 30, even when the capacitor 22 is charged with induced voltage of the fan motor 19b, the control power source 32 generates control voltage, and the heat source microcomputer 42 is accordingly activated, the capacitor is confirmed not to be charged via the proper route and the main relay 87 is not turned on and does not conduct the power source line.

(7-5)

In the air conditioner 100, even when the propeller fan 19a of the heat source fan 19 is rotated by external force, the capacitor 22 is charged with induced voltage of the fan motor 19b, the control power source 32 generates control voltage, and the heat source microcomputer 42 is accordingly activated, the capacitor is confirmed not to be charged via the proper route and the main relay 87 is not turned on and does not conduct the power source line.

(7-6)

The heat source microcomputer 42 also functions as the microcomputer for the power source circuit 20, thereby contributing to reduction of the number of components.

Second Embodiment

The first embodiment exemplifies, as a condition for "not turning on the main relay 87", that "the DC bus voltage Vdc does not reach the appropriate charge voltage Vchg (Vdc<Vchg)".

However, the present disclosure is not limited to this case. If it is determined whether or not charge current flows to the capacitor 22 to find that no charge current flows, the capacitor 22 is estimated to be charged with induced voltage of the fan motor 19b. This can also be a condition for "not turning on the main relay 87".

Figure 9:
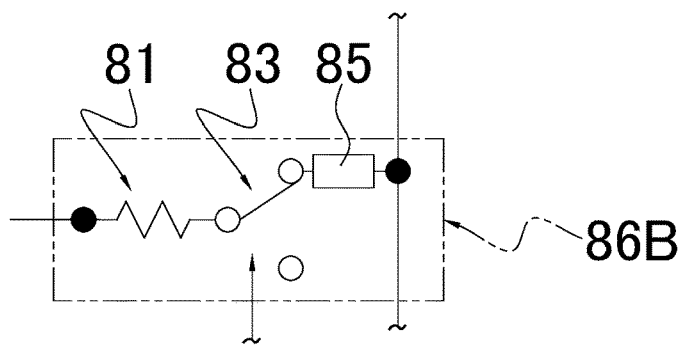
FIG. 9 is an enlarged view of a current limiting circuit according to a second embodiment.

FIG. 9 is an enlarged view of a current limiting circuit 86B according to the second embodiment. As depicted in FIG. 9, the current limiting circuit 86B is different from the current limiting circuit 86 according to the above embodiment in that the current limiting circuit 86B includes a charge current detector 85.

When the capacitor 22 is charged via the proper route, the control power source 32 generates control voltage, and the heat source microcomputer 42 is activated, the heat source microcomputer 42 can detect charge current by means of the charge current detector 85.

(1) Operation

With reference to the drawings, description is made below to control of the main relay 87 by the heat source microcomputer 42 according to the second embodiment.

Figure 10:
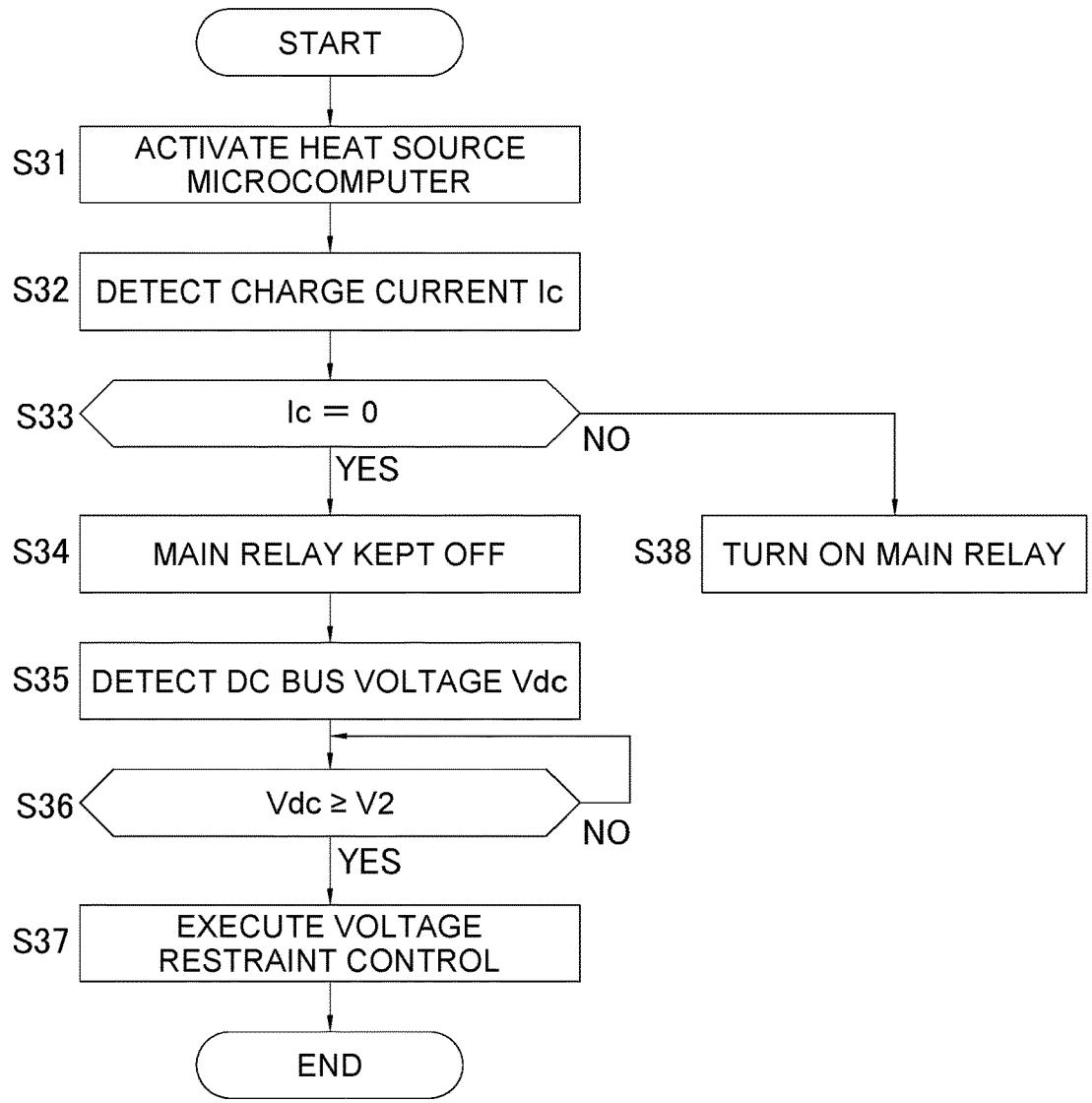
FIG. 10 is a flowchart of control according to the second embodiment, from activation of a heat source microcomputer with induced voltage until voltage restraint control.

FIG. 10 is a flowchart according to the second embodiment, from activation of the heat source microcomputer 42 with induced voltage until voltage restraint control.

(Step S31)

Initially in step S31, the heat source microcomputer 42 is supplied with control voltage from the control power source 32 and is activated.

(Step S32)

Subsequently in step S32, the heat source microcomputer 42 detects charge current Ic by means of the charge current detector 85.

(Step S33)

Subsequently in step S33, the heat source microcomputer 42 determines whether or not the charge current Ic is zero. The flow proceeds to step S34 when the heat source microcomputer 42 determines that the charge current Ic=0 is satisfied, and proceeds to step S38 in another case.

(Step S34)

Subsequently in step S34, the heat source microcomputer 42 does not turn on the main relay 87. It is because the capacitor 22 is not charged via the proper route. If the main relay 87 is turned on in this case, rush current may be generated to damage any component constituting the inverter 25.

(Step S35)

Subsequently in step S35, the heat source microcomputer 42 detects the DC bus voltage Vdc by means of the voltage detector 23.

(Step S36)

Subsequently in step S36, the heat source microcomputer 42 determines whether or not the detection value (Vdc) of the voltage detector 23 is equal to or more than the second threshold V2, and the flow proceeds to step S37 when the heat source microcomputer 42 determines that Vdc≥V2 is satisfied.

(Step S37)

Subsequently in step S37, the heat source microcomputer 42 executes "voltage restraint control" as described in the above first embodiment.

(Step S38)

When the heat source microcomputer 42 does not determine that "the charge current Ic=0 is satisfied" in preceding step S33, the heat source microcomputer 42 turns on the main relay 87 in step S38. The capacitor 22 is charged via the proper route because the charge current Ic>0 is satisfied. Rush current will be restrained in this case even when the main relay 87 is turned on.

The above step has, as the only determination condition for transition to step S34, "whether or not the charge current Ic is zero". Because it takes time to charge the capacitor 22, there may be an additional determination condition "whether or not the charge current Ic is zero for predetermined time", which is relevant to charge time.

(2) Characteristics of Second Embodiment

In the air conditioner 100, when the heat source microcomputer 42 is activated but no current flowing to the current limiting resistance 81 is detected, the heat source microcomputer 42 determines that "the capacitor 22 is not charged via the proper route", and the main relay 87 is not turned on and does not conduct the power source line.

This configuration avoids start of charging the capacitor 22 without current limitation, to restrain damage of any component due to rush current.

Third Embodiment

As described in the above ordinary operation of charging the capacitor 22, the heat source microcomputer 42 turns off the current limiting relay 83 and turns on the main relay 87 in accordance with the command received by the heat source communicator 36 from the utilization unit 2.

The heat source microcomputer 42 having been activated can determine whether or not the capacitor 22 is charged via the proper route by communicating with the utilization unit 2 to check whether or not the current limiting resistance 81 is electrified.

(1) Operation

Figure 11:
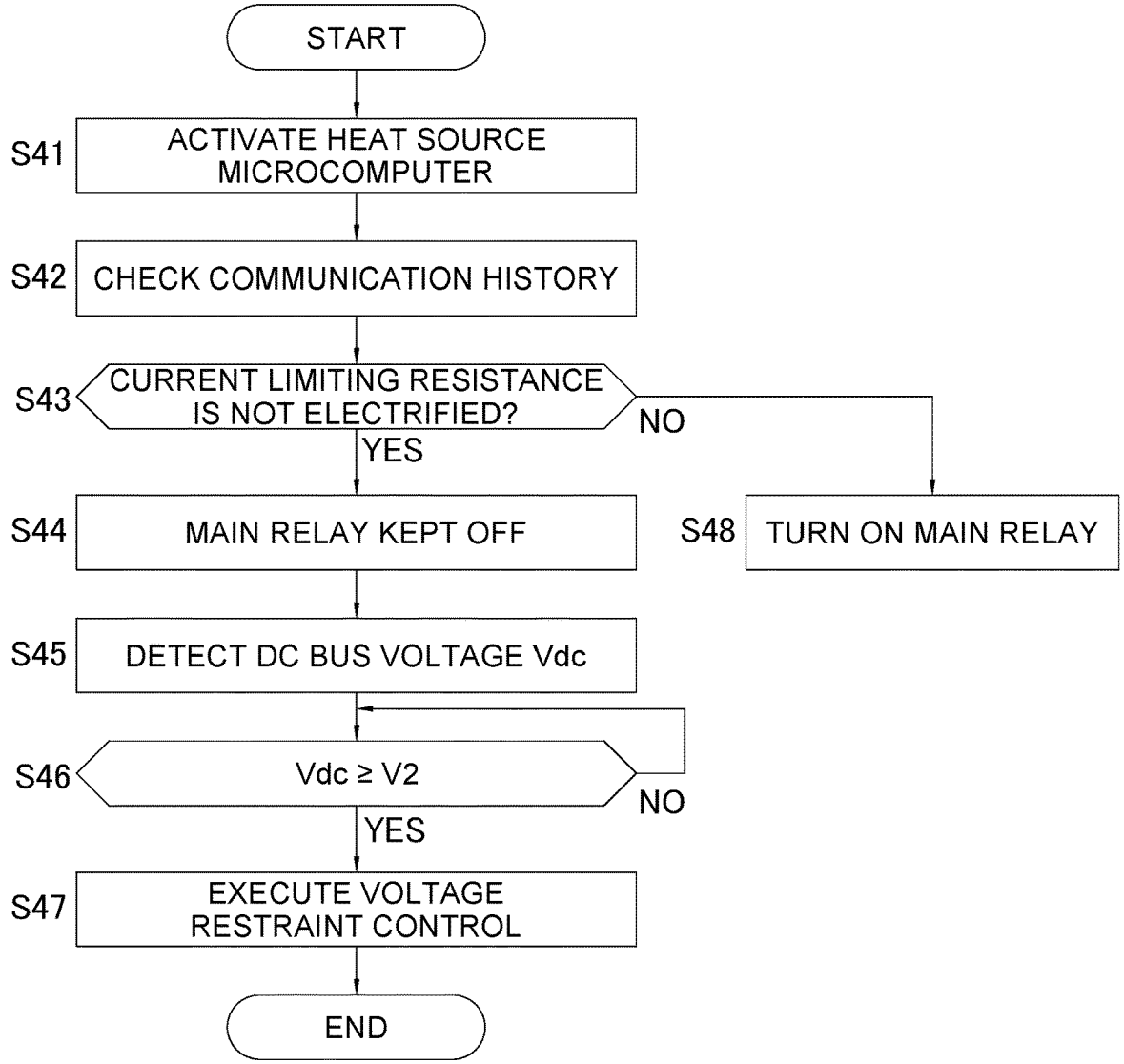
FIG. 11 is a flowchart of control according to a third embodiment, from activation of a heat source microcomputer with induced voltage until voltage restraint control.

FIG. 11 is a flowchart of control according to the third embodiment, from activation of the heat source microcomputer 42 with induced voltage until voltage restraint control.

(Step S41)

Initially in step S41, the heat source microcomputer 42 is supplied with control voltage from the control power source 32 and is activated.

(Step S42)

Subsequently in step S42, the heat source microcomputer 42 checks a communication history of the heat source communicator 36.

(Step S43)

Subsequently in step S43, the heat source microcomputer 42 determines whether or not the current limiting resistance 81 is electrified in accordance with a request command from the utilization unit 2. The flow proceeds to step S44 when the heat source microcomputer 42 determines that "the current limiting resistance 81 is not electrified", and proceeds to step S48 in another case.

(Step S44)

Subsequently in step S44, the heat source microcomputer 42 does not turn on the main relay 87. It is because the capacitor 22 is not charged via the proper route. If the main relay 87 is turned on in this case, rush current may be generated to damage any component constituting the inverter 25.

(Step S45)

Subsequently in step S45, the heat source microcomputer 42 detects the DC bus voltage Vdc by means of the voltage detector 23.

(Step S46)

Subsequently in step S46, the heat source microcomputer 42 determines whether or not the detection value (Vdc) of the voltage detector 23 is equal to or more than the second threshold V2, and the flow proceeds to step S47 when the heat source microcomputer 42 determines that Vdc≥V2 is satisfied.

(Step S47)

Subsequently in step S47, the heat source microcomputer 42 executes "voltage restraint control" as described in the above first embodiment.

(Step S48)

When the heat source microcomputer 42 does not determine that "the current limiting resistance 81 is not electrified" in preceding step S43, the heat source microcomputer 42 turns on the main relay 87 in step S48. The capacitor 22 is charged via the proper route because the current limiting resistance 81 is electrified, in other words, the current limiting relay 83 is turned on. Rush current will be restrained in this case even when the main relay 87 is turned on.

The above step has, as the only determination condition for transition to step S44, "whether or not the current limiting resistance 81 is electrified". Because it takes time to charge the capacitor 22, there may be an additional determination condition "whether or not the current limiting resistance 81 is electrified for predetermined time", which is relevant to charge time.

(2) Characteristics of Third Embodiment

In the air conditioner 100, when the heat source microcomputer 42 is activated but cannot confirm that the current limiting resistance 81 is electrified from information on communication between the utilization communicator 35 and the heat source communicator 36, the heat source microcomputer 42 determines that "the capacitor 22 is not charged via the proper route", and the main relay 87 is not turned on and does not conduct the power source line.

This configuration avoids start of charging the capacitor 22 without current limitation, to restrain damage of any component due to rush current.

Fourth Embodiment

The motor drive circuit 30 according to each of the above embodiments is equipped with the inverter 25. The motor drive circuit 30 may be equipped with a circuit configured to detect a power-source voltage phase of the AC power source (hereinafter, referred to as a power-source voltage phase detection circuit) for control of the inverter. The power-source voltage phase detection circuit is also equipped when the rectifier circuit includes a switch for control in synchronization with a power source phase.

(1) Configuration of Motor Drive Circuit 30

Figure 12:
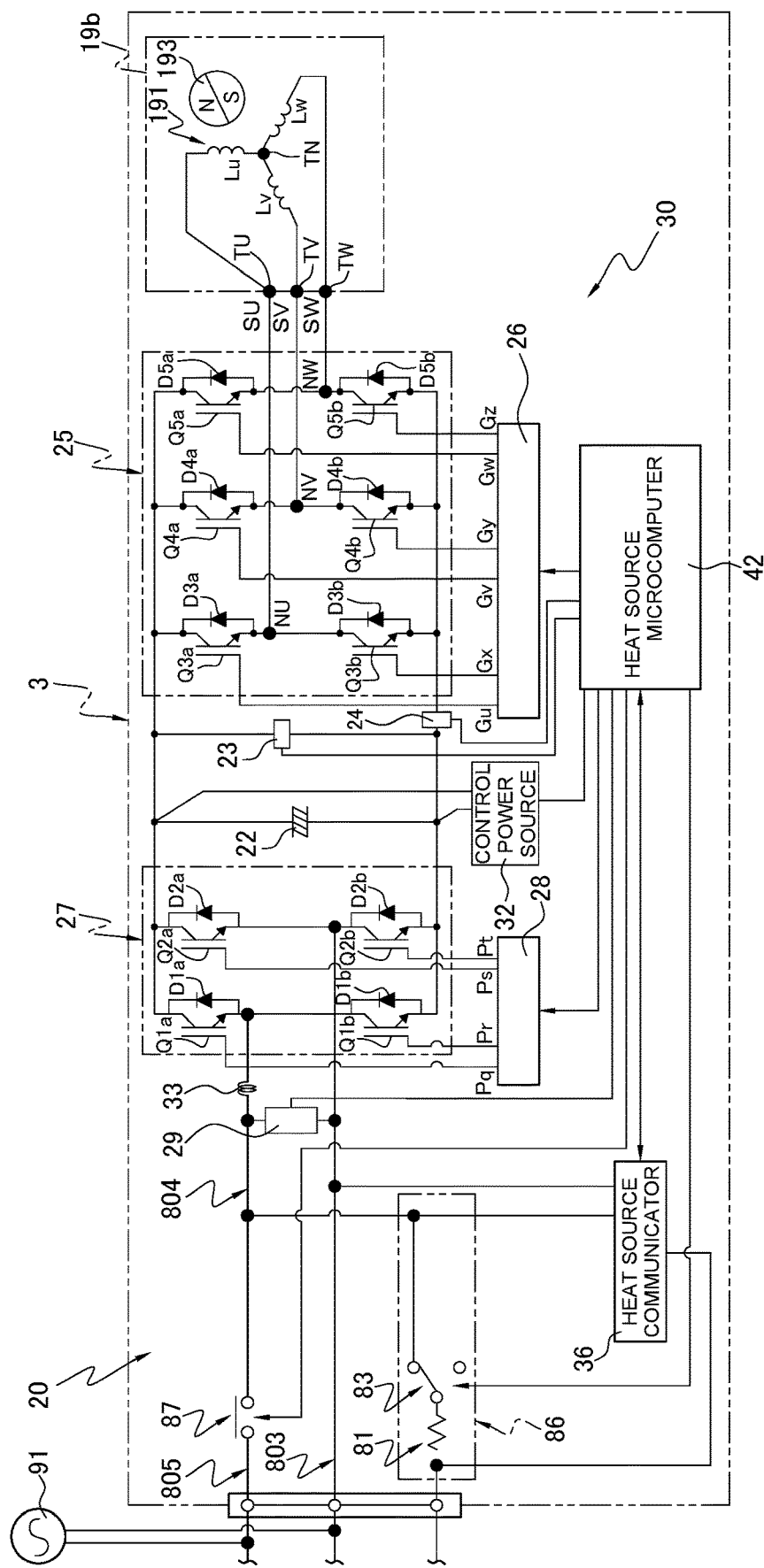
FIG. 12 is a circuit block diagram of a motor drive circuit including a power source circuit according to a fourth embodiment of the present disclosure.

FIG. 12 is a circuit block diagram of a motor drive circuit including a power source circuit according to the fourth embodiment of the present disclosure. The circuit for the utilization unit 2 is configured similarly to that depicted in FIG. 2 and is excluded in FIG. 12. The motor drive circuit depicted in FIG. 12 is different from the motor drive circuit depicted in FIG. 2 according to the first embodiment in that the rectifier circuit 21 is replaced with a converter 27, and a gate drive circuit 28, a power-source voltage phase detection circuit 29, and a reactor 33 are provided additionally. The remaining configuration is similar to that according to the first embodiment.

The converter 27, the gate drive circuit 28, the power-source voltage phase detection circuit 29, and the reactor 33 will be described below and the remaining configuration will not be described repeatedly.

(1-1) Converter 27

The converter 27 depicted in FIG. 12 includes a plurality of insulated gate bipolar transistors (IGBTs, hereinafter simply called transistors) Q1a, Q1b, Q2a, and Q2b, and a plurality of diodes D1a, D1b, D2a, and D2b.

The transistors Q1a and Q1b are connected in series to constitute upper and lower arms, and a connection point therebetween is connected to the first one of the poles of the AC power source 91 via the power source line 805, the main relay 87, and the power source line 804.

The transistors Q2a and Q2b are connected in series to constitute upper and lower arms, and a connection point therebetween is connected to the second one of the poles of the AC power source 91 via the power source line 803.

The diodes D1a to D2b are connected parallelly to the transistors Q1a to Q2b such that collector terminals of the transistors are connected to cathode terminals of the diodes and emitter terminals of the transistors are connected to anode terminals of the diodes. The transistors and the diodes connected parallelly constitute switching elements.

The converter 27 turns on or off the transistors Q1a to Q2b at timing commanded by the gate drive circuit 28.

(1-2) Gate Drive Circuit 28

The gate drive circuit 28 changes the on or off state of each of the transistors Q1a to Q2b in the converter 27 in accordance with command voltage from the heat source microcomputer 42. Specifically, the gate drive circuit 28 generates pulsatile gate control voltages Pq, Pr, Ps, and Pt having a duty determined by the heat source microcomputer 42 such that current flowing from the AC power source 91 to the heat source is controlled to have a predetermined value. The gate control voltages Pq, Pr, Ps, and Pt thus generated are applied to gate terminals of the transistors Q1a to Q2b.

(1-3) Power-Source Voltage Phase Detection Circuit 29

The power-source voltage phase detection circuit 29 detects a phase at a time point when AC voltage of the AC power source 91 reaches predetermined phase detection reference voltage, and transmits, to the heat source microcomputer 42, a signal having a pulse width according to the phase.

(1-4) Reactor 33

The reactor 33 is provided between the AC power source 91 and the converter 27, and is connected to the AC power source 91 in series. Specifically, the reactor 33 has a first end connected to the power source line 804 connected to the AC power source 91, and a second end connected to one of input ends of the converter 27.

The heat source microcomputer 42 receives the signal transmitted from the power-source voltage phase detection circuit 29, turns on or off the transistors Q1a and Q1b or the transistors Q2a and Q2b of the upper and lower arms in the converter 27 for short circuiting or circuit opening for predetermined time, and controls current to have a substantially sin wave shape or the like for improvement of a power source input power factor or restraint of a harmonic component.

The heat source microcomputer 42 may alternatively execute cooperative control of the converter and the inverter such that a short circuiting period is controlled in accordance with a duty ratio of gate control voltage for control of the inverter 25.

As described above, the power-source voltage phase detection circuit 29 is disposed more adjacent to the converter 27 than the main relay 87, the current limiting resistance 81, and the current limiting relay 83 when viewed from the power source. The power-source voltage phase detection circuit 29 is thus supplied with electric power from the AC power source 91 and detects a phase when the capacitor 22 is charged via the proper route.

Detection of no phase by the power-source voltage phase detection circuit indicates that the capacitor 22 is not charged via the proper route. In this case, the main relay 87 will be controlled so as not to be turned on even if the heat source microcomputer 42 is activated.

(2) Operation

Figure 13:
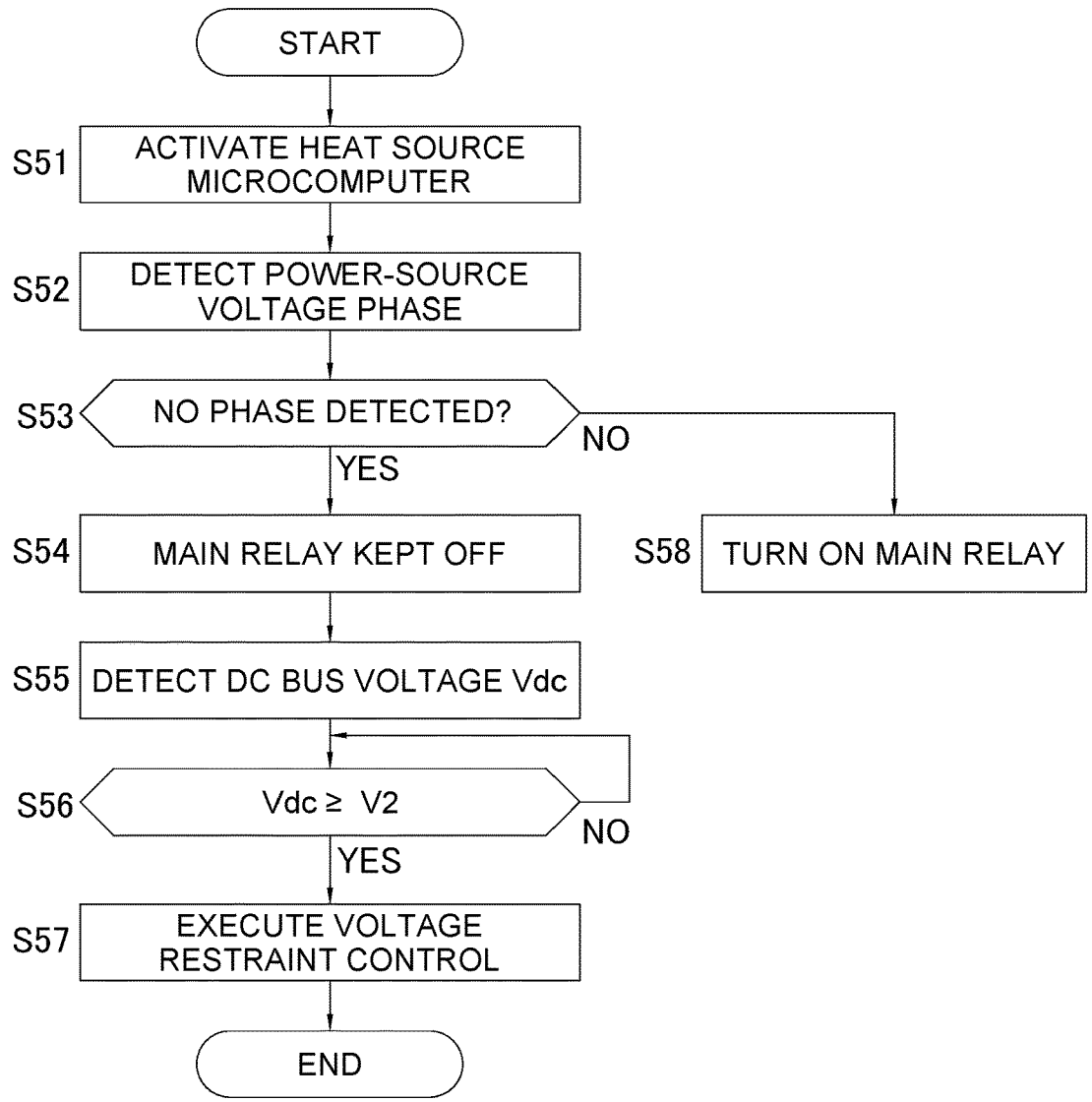
FIG. 13 is a flowchart of control according to the fourth embodiment, from activation of a heat source microcomputer with induced voltage until voltage restraint control.

FIG. 13 is a flowchart of control according to the fourth embodiment, from activation of the heat source microcomputer 42 with induced voltage until voltage restraint control.

(Step S51)

Initially in step S51, the heat source microcomputer 42 is supplied with control voltage from the control power source 32 and is activated.

(Step S52)

Subsequently in step S52, the heat source microcomputer 42 detects a power-source voltage phase.

(Step S53)

Subsequently in step S53, the heat source microcomputer 42 determines whether or not the power-source voltage phase can be detected. The flow proceeds to step S54 when the heat source microcomputer 42 determines that "the power-source voltage phase cannot be detected", and proceeds to step S58 in another case.

(Step S54)

Subsequently in step S54, the heat source microcomputer 42 does not turn on the main relay 87. It is because the capacitor 22 is not charged via the proper route. If the main relay 87 is turned on in this case, rush current may be generated to damage any component constituting the inverter 25.

(Step S55)

Subsequently in step S55, the heat source microcomputer 42 detects the DC bus voltage Vdc by means of the voltage detector 23.

(Step S56)

Subsequently in step S56, the heat source microcomputer 42 determines whether or not the detection value (Vdc) of the voltage detector 23 is equal to or more than the second threshold V2, and the flow proceeds to step S57 when the heat source microcomputer 42 determines that Vdc≥V2 is satisfied.

(Step S57)

Subsequently in step S57, the heat source microcomputer 42 executes "voltage restraint control" as described in the above first embodiment.

(Step S58)

When the heat source microcomputer 42 determines that "the power-source voltage phase can be detected" in preceding step S53, the heat source microcomputer 42 turns on the main relay 87 in step S58. The capacitor 22 is charged via the proper route because the power-source voltage phase can be detected. Rush current will be restrained in this case even when the main relay 87 is turned on.

The above step has, as the only determination condition for transition to step S54, "whether or not the power-source voltage phase can be detected". Because it takes time to charge the capacitor 22, there may be an additional determination condition "whether or not the power-source voltage phase can be detected for predetermined time", which is relevant to charge time.

(3) Characteristics of Fourth Embodiment

In the air conditioner 100, when the heat source microcomputer 42 is activated but the power-source voltage phase detection circuit cannot detect any phase, the heat source microcomputer 42 determines that "the capacitor 22 is not charged via the proper route", and the main relay 87 is not turned on and does not conduct the power source line.

This configuration avoids start of charging the capacitor 22 without current limitation, to restrain damage of any component due to rush current.

Others

Each of the above embodiments and the modification example exemplifies the case where the current limiting relay 83 is on in the standby state. However, the present disclosure is not limited to this case.

The current limiting relay 83 may alternatively be off in the standby state, and be configured to be turned on when the activation relay 80 in the utilization unit 2 is turned on.

In this configuration, when the heat source microcomputer 42 is activated but the current limiting relay 83 is not on and cannot allow current to flow to the current limiting resistance 81, the heat source microcomputer 42 determines that "the capacitor 22 is not charged via the proper route", and the main relay 87 is not turned on and does not conduct the power source line.

This configuration avoids start of charging the capacitor 22 without current limitation, to restrain damage of any component due to rush current.

The embodiments of the present disclosure have been described above. Various modifications to modes and details will be apparently available without departing from the object and the scope of the present disclosure recited in the claims.

The above embodiments exemplify the motor configured as a brushless DC motor. The motor configured as a motor provided with a brush is applicable similarly because induced voltage is generated by rotation of the motor. The motor is thus expressed as the "DC motor" commonly applicable to the brushless DC motor and the motor provided with the brush.

INDUSTRIAL APPLICABILITY

The present disclosure provides a motor drive circuit that is applicable as a drive circuit for a fan motor as well as a motor configured to be rotated by external force to generate induced voltage.

REFERENCE SIGNS LIST

2: utilization unit
3: heat source unit
11: refrigerant circuit
17: heat-source heat exchanger
19: heat source fan (fan)
19b: fan motor (DC motor)
20: power source circuit
21: rectifier circuit
22: capacitor
23: voltage detector
29: power-source voltage phase detection circuit
30: motor drive circuit
32: control power source
35: utilization communicator
36: heat source communicator
42: heat source microcomputer
81: current limiting resistance
83: current limiting relay
85: charge current detector
87: main relay
91: AC power source
100: refrigeration apparatus

CITATION LIST

Patent Literature

Patent Literature 1: JP 2015-233396 A

The invention claimed is:

1. A power source circuit configured to supply at least a pair of DC buses with electric power, the power source circuit comprising:
    a rectifier circuit configured to rectify AC voltage of an AC power source;
    a capacitor connected to an output end of the rectifier circuit;
    a main relay configured to turn on or off a contact point to switch into a state of conducting or a state of not conducting a power source line connecting the AC power source and the capacitor;
    a power-source voltage phase detection circuit configured to detect a phase of the AC power source; and
    a microcomputer configured to determine whether or not to conduct the power source line, wherein
    when the microcomputer is activated,
    the microcomputer controls the main relay so as not to conduct the power source line in a case where the power-source voltage phase detection circuit does not detect any phase.

2. The power source circuit according to claim 1, further comprising a voltage detector configured to detect a DC bus voltage, wherein
    the microcomputer does not conduct the power source line when the voltage detector has a detection value equal to or less than a predetermined threshold.

3. The power source circuit according to claim 2, wherein the voltage detector detects, as the DC bus voltage, interterminal voltage of the capacitor.

4. A motor drive circuit configured to drive a DC motor, the motor drive circuit comprising
    the power source circuit according to claim 1, configured to supply the DC buses with electric power; and
    an inverter configured to receive DC bus power supplied by the power source circuit and generate drive voltages for driving the DC motor.

5. The motor drive circuit according to claim 4, further comprising
    a control power source configured to generate, with induced voltage of the DC motor, control voltage for activation of the microcomputer in the power source circuit.

6. A refrigeration apparatus comprising:
    a utilization unit;
    a heat source unit connected to said utilization unit via a pipe to constitute a refrigerant circuit; and the motor drive circuit according to claim 4, configured to drive the DC motor included in the refrigeration apparatus.

7. The refrigeration apparatus according to claim 6, wherein
the heat source unit includes
a heat-source heat exchanger functioning as a radiator or an evaporator of the refrigerant circuit, and
a fan configured to generate an air flow to the heat-source heat exchanger, and
the motor drive circuit drives a DC motor included in the fan.

8. The refrigeration apparatus according to claim 6, further comprising
a heat source microcomputer configured to control the heat source unit, wherein
the heat source microcomputer also functions as the microcomputer for the power source circuit.

9. A motor drive circuit configured to drive a DC motor, the motor drive circuit comprising
the power source circuit according to claim 2, configured to supply the DC buses with electric power; and
an inverter configured to receive DC bus power supplied by the power source circuit and generate drive voltages for driving the DC motor.

10. A motor drive circuit configured to drive a DC motor, the motor drive circuit comprising
the power source circuit according to claim 3, configured to supply the DC buses with electric power; and
an inverter configured to receive DC bus power supplied by the power source circuit and generate drive voltages for driving the DC motor.

11. A refrigeration apparatus comprising:
a utilization unit;
a heat source unit connected to said utilization unit via a pipe to constitute a refrigerant circuit, the refrigeration apparatus further comprising
the motor drive circuit according to claim 5, configured to drive the DC motor included in the refrigeration apparatus.

12. A power source circuit configured to supply a DC motor with electric power via at least a pair of DC buses, the power source circuit comprising:
a rectifier circuit configured to rectify AC voltage of an AC power source;
a capacitor connected to an output end of the rectifier circuit;
a main relay configured to turn on or off a contact point to switch into a state of conducting or a state of not conducting a power source line connecting the AC power source and the capacitor;
a current limiting resistance configured to limit current flowing to the capacitor;
a current limiting relay configured to turn on or off a contact point to switch into a first state of allowing current to flow to the current limiting resistance or a second state of not allowing current to flow to the current limiting resistance, the current limiting relay being in the second state during standby;
a microcomputer configured to determine whether or not to conduct the power source line; and
a control power source configured to generate, with induced voltage of the DC motor, control voltage for activation of the microcomputer, wherein
when the microcomputer is activated,
the microcomputer controls the main relay so as not to conduct the power source line when the current limiting relay is in the second state.

13. A refrigeration apparatus comprising a utilization unit and a heat source unit connected via a pipe to constitute a refrigerant circuit, the refrigeration apparatus further comprising:
the power source circuit according to claim 12, configured to supply a DC motor included in the refrigeration apparatus with electric power; and
a utilization communicator and a heat source communicator provided for communication between the utilization unit and the heat source unit, wherein
the microcomputer in the power source circuit does not conduct the power source line when acquiring information indicating that the current limiting relay is in the second state from information communicated between the utilization communicator and the heat source communicator.

14. The refrigeration apparatus according to claim 13, wherein
the heat source unit includes
a heat-source heat exchanger functioning as a radiator or an evaporator of the refrigerant circuit, and
a fan configured to generate an air flow to the heat-source heat exchanger, and
the power source circuit supplies a DC motor included in the fan with electric power.

15. The refrigeration apparatus according to claim 13, further comprising
a control power source configured to generate, with induced voltage of the DC motor, control voltage for activation of the microcomputer in the power source circuit.

16. The refrigeration apparatus according to claim 14, further comprising
a control power source configured to generate, with induced voltage of the DC motor, control voltage for activation of the microcomputer in the power source circuit.

\* \* \* \* \*